(12) United States Patent
Matubara (10) Patent No.: US 7,342,263 B2
(45) Date of Patent: Mar. 11, 2008

(54) CIRCUIT DEVICE

(75) Inventor: Naoteru Matubara, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 173 days.

(21) Appl. No.: 11/078,370

(22) Filed: Mar. 14, 2005

(65) Prior Publication Data

US 2005/0199975 A1    Sep. 15, 2005

(30) Foreign Application Priority Data

Mar. 15, 2004 (JP) .............................. 2004-073588

(51) Int. Cl.
*H01L 27/20* (2006.01)
*H01L 29/84* (2006.01)
(52) U.S. Cl. .................. 257/254; 257/245; 257/416; 257/444; 257/680; 257/E23.188; 257/E23.193
(58) Field of Classification Search ................ 257/444, 257/427, E51.026, E33.077, E31.054, 331.01, 257/245, 254, 416, 680, E23.188, E23.193
See application file for complete search history.

(56) References Cited

U.S. PATENT DOCUMENTS 4,838,089 A * 6/1989 Okada et al. ................. 73/727

2003/0216010 A1 * 11/2003 Atlas ........................... 438/462
2005/0146000 A1 * 7/2005 Kim et al. .................. 257/670

FOREIGN PATENT DOCUMENTS

WO    WO 01/19134 A2    3/2001

OTHER PUBLICATIONS

Mullenborn et al.; "Stacked Silicon Microphones"; *Eurosensors XIV*; pp. 209-212; c. 2000; Denmark.

* cited by examiner

*Primary Examiner*—Long K. Tran
(74) *Attorney, Agent, or Firm*—McDermott Will & Emery LLP (57) ABSTRACT

A circuit device is provided which can be manufactured at reduced costs and which is highly reliable. The circuit device includes a Sensor area formed on part of a semiconductor substrate, a circuit area formed around the sensor area on the semiconductor substrate to process electric signals produced at the sensor area, and a sealring disposed between the sensor area and the circuit area. The sealring is disposed between the outer periphery of the sensor area and the inner periphery of the circuit area to surround the sensor area. In the circuit device, the sealring prevents water or moisture from infiltrating from the sensor area into the circuit area.

10 Claims, 11 Drawing Sheets

CIRCUIT DEVICE

BACKGROUND OF THE INVENTION

1. Field of the Invention

The present invention relates to a circuit device.

2. Description of the Related Art

Recently, such a circuit device has been suggested which incorporates both a sensor such as a microphone and an application specific integrated circuit (ASIC).

Such a circuit device can put intelligence in the sensor.

For example, a circuit device with a microphone incorporated as the sensor would be able to realize a voice recognition capability, semantic conversion capability, bilingual capability or the like.

For example, the aforementioned circuit device includes those described in Japanese National Publication of International Application No. 2003-508998 and "Stacked Silicon Microphones", by M. Mullenborn et al., EUROSENSORS, XIV, pp 209-212.

The circuit devices described in these documents implement a sensor and an ASIC on separate chips, in which the flip-chip bonding technology is used to individually implement both the chips on a silicon substrate.

This allows the sensor and the ASIC to be electrically connected with each other via the silicon substrate.

However, the circuit devices configured as described above are manufactured at high costs.

That is, the circuit devices configured as mentioned above are manufactured at high overall costs due to at least three types of costs required for their fabrication. That is, these costs are required for (i) forming a sensor on a first substrate to fabricate a first chip, (ii) forming an ASIC on a second substrate to fabricate a second chip, and (iii) implementing the first and second chips on a silicon substrate carrier.

To address this problem, the sensor and the ASIC may be formed on the same chip.

However, in general, ASICs are preferably isolated from ambient air as much as possible in order to prevent water or moisture from infiltrating therein. In contrast to this, sensors must be exposed to ambient air in order to sense required information.

In this context, there is apprehension that a circuit device having a sensor and an ASIC formed on the same chip may cause the ASIC to be infiltrated with water or moisture from where the sensor is formed.

When water or moisture infiltrates into the ASIC, water molecules ($H_2O$) may spread through the inter-layer dielectric film. This can give rise to corrosion of the conductors and deterioration of circuit components such as transistors, thereby causing the circuit device to be reduced in reliability.

SUMMARY OF THE INVENTION

It is therefore an object of the present invention to provide a circuit device which can be manufactured at reduced costs and which is highly reliable.

To solve the aforementioned problems, a circuit device according to the present invention comprises a sensor area formed on part of a substrate, a circuit area formed around the sensor area on the substrate to process a signal produced at the sensor area, and a moisture resistant member disposed between the sensor area and the circuit area.

The moisture resistant member disposed between the sensor area and the circuit area allows the circuit device to prevent water or moisture from infiltrating from the sensor area into the circuit area.

This makes it possible to form the sensor area and the circuit area on the same chip while water or moisture is prevented from infiltrating into the circuit area.

By way of example, the moisture resistant member may be a sealring.

The moisture resistant member is formed of conductors and contacts stacked alternately in layers, in which the aforementioned conductors and contacts may be formed of the same materials as used for conductors and contacts of the circuit area, respectively.

In this case, the moisture resistant member can be formed in the same process as that for the conductors and contacts in the circuit area, thereby simplifying the fabrication process of the circuit device.

The moisture resistant member may have a substantially flat side face opposed to the sensor area.

In manufacturing the circuit device, the moisture resistant member serves as an etching stopper, thereby providing a flat exposed surface (i.e., the aforementioned side face) after having been etched.

This arrangement can provide an improved coverage effect to a passivation film or the like for coating the aforementioned exposed surface.

The substrate may have a conductive layer for electrically connecting between the sensor area and the circuit area.

In this case, this simple arrangement allows for communicating electric signals between the sensor area and the circuit area.

The aforementioned circuit device may include a bonding wire for electrically connecting between the sensor area and the circuit area.

Again in this case, this simple arrangement allows for communicating electric signals between the sensor area and the circuit area.

The aforementioned circuit device may also have a second moisture resistant member disposed to surround the circuit area.

In this case, it is possible to prevent the circuit area from being infiltrated with water or moisture through the periphery thereof.

This arrangement, in combination with the moisture resistant member disposed between the sensor area and the circuit area, ensures more satisfactorily that the circuit area is prevented from being infiltrated with water or moisture.

An upper surface of the circuit area may be coated with a passivation film.

In this case, it is possible to prevent the circuit area from being infiltrated with water or moisture through the upper surface thereof.

This arrangement, in combination with the moisture resistant member disposed between the sensor area and the circuit area, ensures more satisfactorily that the circuit area is prevented from being infiltrated with water or moisture.

The conductors in the circuit area may be multi-layer conductors.

In this case, the circuit device according to the present invention is particularly useful.

The conductors in the circuit area may be formed of copper.

In this case, low resistance of copper would enable the circuit area to operate at increased speeds.

An application specific integrated circuit may be employed in the circuit area.

In this case, the circuit area can perform sophisticated signal processing.

A microphone may be employed in the sensor area.

In this case, the circuit device according to the present invention is particularly useful.

The moisture resistant member may be formed continuously to define the sensor area and the circuit area.

In this case, it is possible to prevent more positively water or moisture from infiltrating from the sensor area into the circuit area.

DETAILED DESCRIPTION OF THE INVENTION

Now, preferred embodiments of a circuit device according to the present invention will be described in detail with reference to the accompanying drawings.

In the drawings, like reference numerals designate like components, which will not be explained repeatedly.

First Embodiment

Figure 1:
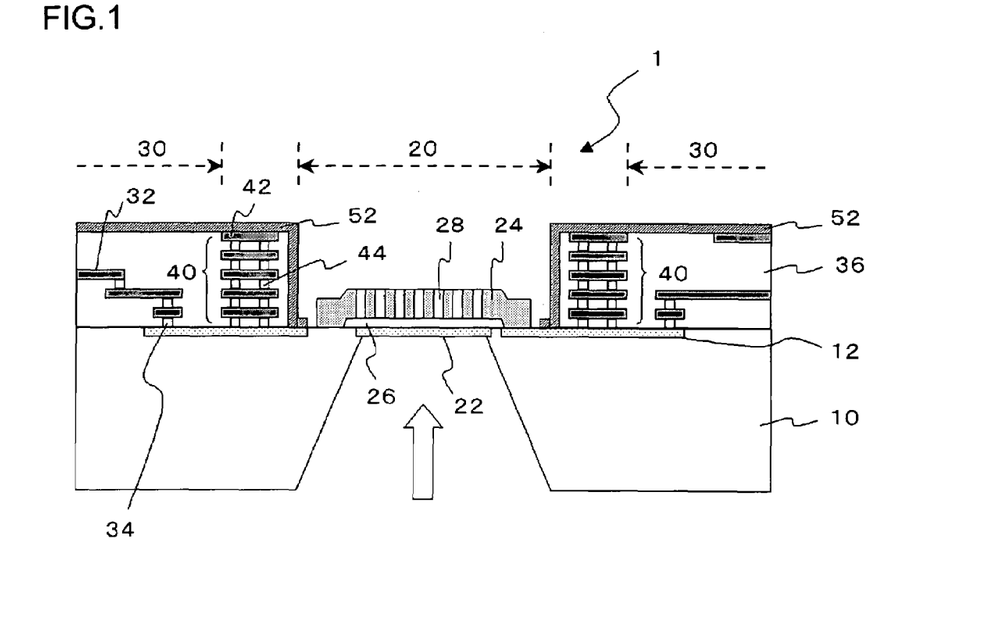
FIG. 1 is a cross-sectional view showing a circuit device according to a first embodiment of the present invention.

FIG. 1 is a cross-sectional view showing a circuit device according to a first embodiment of the present invention.

Figure 2:
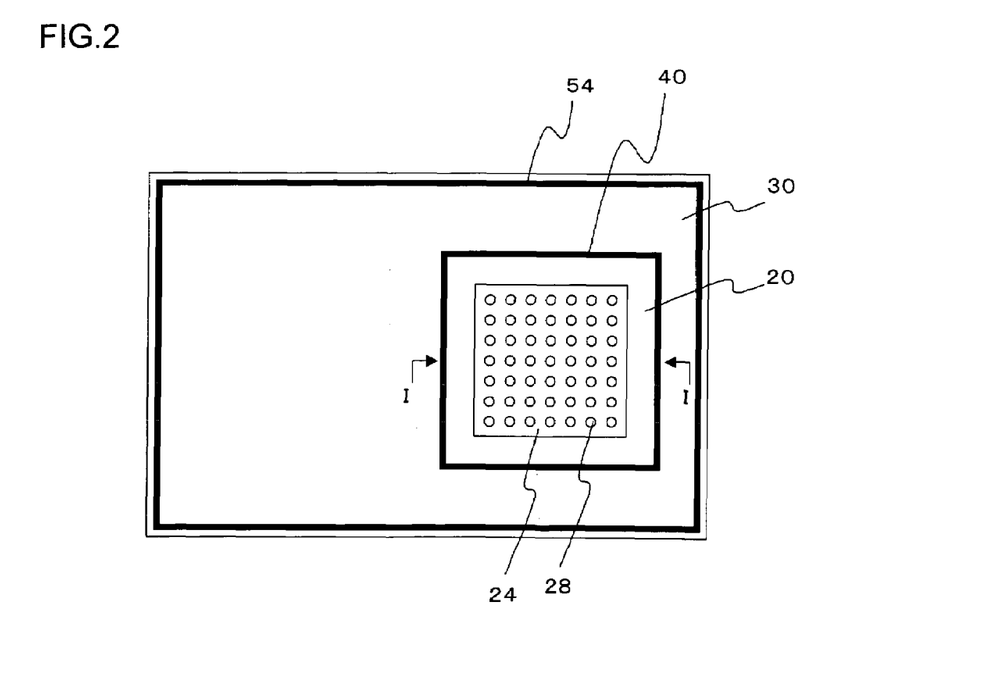
FIG. 2 is a plan view showing the circuit device according to the first embodiment of the present invention.

FIG. 2 is a plan view showing the circuit device according to the first embodiment of the present invention.

FIG. 1 shows a cross-sectional view taken along the line I-I of FIG. 2.

The circuit device 1 includes a sensor area 20 formed on part of a semiconductor substrate 10, a circuit area 30 formed around the sensor area 20 on the semiconductor substrate 10, and a sealring 40 (a moisture resistant member) disposed between the sensor area 20 and the circuit area 30.

As shown in FIG. 1, there is formed a conductive layer 12 in part of the surface of the semiconductor substrate 10.

The conductive layer 12 electrically connects between the sensor area 20 and the circuit area 30.

For example, the semiconductor substrate 10 can be a silicon substrate.

The conductive layer 12 may also be formed as a diffusion layer.

A microphone is employed in the sensor area 20, which includes a diaphragm 22 and a back plate electrode 24.

The diaphragm 22 is part of the rear side of the semiconductor substrate 10 which is recessed and reduced in thickness to be a thin plate to oscillate under the pressure of sound waves (indicated by the arrow in FIG. 1) incident upon the rear of the semiconductor substrate 10.

The back plate electrode 24 is placed so as to cover the diaphragm 22 on the semiconductor substrate 10 and produces electric signals in response to the diaphragm 22 being vibrated.

Here, the back plate electrode 24 is disposed so as to provide a certain gap (an air gap 26) between the back plate electrode 24 and the diaphragm 22.

The back plate electrode 24 is also in contact with the conductive layer 12 at a portion on the surface of the semiconductor substrate 10 where the diaphragm 22 is not formed.

Additionally, the back plate electrode 24 is provided with acoustic holes 28 to release pressures which are developed in the air gap 26 by the diaphragm 22 being vibrated.

As shown in FIG. 2, a plurality of acoustic holes 28 are arranged in rows and columns in the back plate electrode 24.

An ASIC is employed in the sensor area 30, which processes electric signals produced at the diaphragm 22 of the sensor area 20 and includes conductors 32, contacts 34, and an dielectric film 36.

The conductors 32 are stacked in layers (five layers in this embodiment), in which adjacent conductors 32 are electrically connected to each other via the contact 34 disposed therebetween.

The conductor 32 in the lowermost layer is connected to the conductive layer 12 via the contact 34 disposed therebetween.

This arrangement allows the back plate electrode 24 of the sensor area 20 and the conductors 32 of the circuit area 30 to be electrically connected therebetween via the conductive layer 12.

For example, the conductors 32 and the contacts 34 can be formed of aluminum and tungsten, respectively.

However, the conductors 32 may also be formed of tungsten or copper, while the contacts 34 may also be formed of aluminum or copper.

The dielectric film 36 is a so-called inter-layer dielectric film which is filled in the circuit area 30 excluding the conductors 32, the contacts 34, and circuit components such as transistors (not shown).

The sealring 40 is configured such that conductors 42 and contacts 44 are alternately stacked in layers.

The conductors 42 and the contacts 44 are formed of the same materials as those used for forming the conductors 32 and the contacts 34 of the circuit area 30, respectively.

The sealring 40, which is disposed between the outer periphery of the sensor area 20 and the inner periphery of the circuit area 30, is continuously formed to define the sensor area 20 and the circuit area 30.

In this embodiment, the periphery of the sensor area 20 is entirely surrounded by the circuit area 30, and correspondingly the sealring 40 is disposed to entirely surround the periphery of the sensor area 20.

That is, the sealring 40 is placed along the outer periphery of the sensor area 20, while the circuit area 30 is placed around the outer periphery of the sealring 40.

For example, the contact 34 of the circuit area 30 is square in shape (e.g., measuring about 0.2 μm per side) in its plan view.

On the other hand, the contact 44 of the sealring 40 is formed linearly so as to surround the sensor area 20.

The circuit area 30 and the sealring 40 are integrated on the semiconductor substrate 10. The aforementioned dielectric film 36 is filled not only in the circuit area 30 but also in the sealring 40 excluding the conductors 42 and the contacts 44.

The upper surface of the circuit area 30 and the sealring 40 is covered with a common passivation film 52.

The passivation film 52 reaches as far as the side face of the dielectric film 36, so that the passivation film 52 is also disposed between the sealring 40 and the sensor area 20.

The passivation film 52 can be an SiN film. As shown in FIG. 2, this embodiment is also configured such that a sealring 54 (i.e., a second moisture resistant member) is provided outside the circuit area 30 so as to surround the circuit area 30.

The sealring 54 is configured in the same manner as the aforementioned sealring 40.

Now, the effects of the circuit device 1 will be described below.

The circuit device 1 has the sealring 40 disposed between the sensor area 20 and the circuit area 30, thereby preventing water or moisture from infiltrating from the sensor area 20 into the circuit area 30.

This allows the sensor area 20 and the circuit area 30 to be formed on the same chip while preventing water or moisture from infiltrating into the circuit area 30.

The circuit device 1 is thus realized which can be manufactured at reduced costs and which is highly reliable.

It is also possible for the sealring 40 to prevent heat generated at the circuit area 30 from transferring to the sensor area 20.

This makes it possible to reduce heat-induced noise in the sensor area.

The sealring 40 includes the conductors 42 and the contacts 44 stacked alternately in layers, in which the conductors 42 and the contacts 44 are formed of the same materials as used for forming the conductors 32 and the contacts 34 of the circuit area 30, respectively.

This arrangement allows for forming the sealring 40 in the same process as followed for forming the conductors 32 and the contacts 34, thereby simplifying the manufacturing steps of the circuit device 1.

The semiconductor substrate 10 has the conductive layer 12 which electrically connects between the sensor area 20 and the circuit area 30.

This simple arrangement allows for communicating electric signals between the sensor area 20 and the circuit area 30.

The conductors 42 of the sealring 40 are formed of the same material as used for the conductors 32 of the circuit area 30.

This allows for forming the conductors 42 and the conductors 32 in the same process, thereby simplifying the manufacturing steps of the circuit device 1.

Furthermore, in this embodiment, since both the contacts 34 and 44 are formed of the same material, the manufacturing steps of the circuit device 1 are further simplified.

The circuit device 1 has also the sealring 54 provided to surround the circuit area 30, thereby making it possible to prevent water or moisture from infiltrating into the circuit area 30 from the surrounding thereof.

This arrangement, in combination with the sealring 40 disposed between the sensor area 20 and the circuit area 30, ensures more satisfactorily that the circuit area 30 is prevented from being infiltrated with water or moisture.

The upper surface of the circuit area 30 is covered with the passivation film 52.

This makes it possible to prevent water or moisture from infiltrating into the circuit area 30 from the upper surface thereof.

This arrangement, in combination with the sealrings 40 and 54, ensures more satisfactorily that the circuit area 30 is prevented from being infiltrated with water or moisture.

In particular, an SiN film would be preferably employed to function as the passivation film 52.

The conductors 32 of the circuit area 30 are stacked in layers.

In general, a circuit area with multi-layered conductors would be prone to be infiltrated with water or moisture especially through the interface between the inter-layer dielectric films. Accordingly, when compared to a single-layer conductor, there is deeper apprehension that water or moisture infiltrates into the circuit area.

Accordingly, the circuit device 1 having the sealring 40 disposed between the sensor area 20 and the circuit area 30 is particularly useful in the case of conductors being stacked in layers.

As described above, since the circuit device 1 can implement multi-layer conductors while preventing water or moisture from infiltrating into the circuit area 30, the circuit device 1 is also suitable to achieve a higher degree of integration of and thus reduce the size of the circuit area 30.

In this embodiment, the conductors are stacked in five layers, but may also be formed in any number of layers.

With the total number of transistors in the circuit area 30 being on the order of five millions, the optimum number of layers is about five.

On the other hand, the conductors needs not to be always stacked in layers, but may also be employed in the form of a single layer.

An ASIC is employed in the circuit area 30.

Accordingly, since the circuit area 30 can perform sophisticated signal processing, a particularly high performance circuit device 1 is realized.

A microphone is employed in the sensor area 20.

In this case, as shown in FIG. 1, the space above the sensor area 20 on the semiconductor substrate 10 is opened to atmosphere so that pressures developed in the air gap 26 can be released into the ambient atmosphere.

Among other things, this arrangement makes water or moisture prone to infiltrate from the sensor area 20 into the circuit area 30.

Accordingly, in such a case like this, the circuit device 1 having the sealring 40 is particularly useful.

When the conductors 32 of the circuit area 30 are formed of copper, low resistance of copper would allow the circuit area 30 to operate at increased speeds.

Figure 3A:
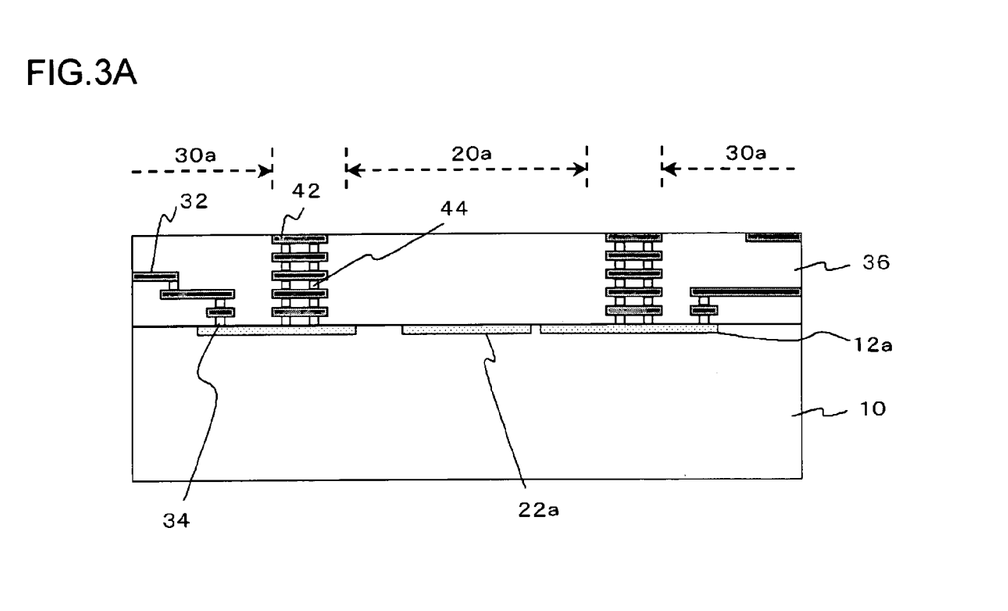
FIGS. 3A and 3B are explanatory views showing an exemplary method for manufacturing the circuit device 1 of FIG. 1.
Figure 3B:
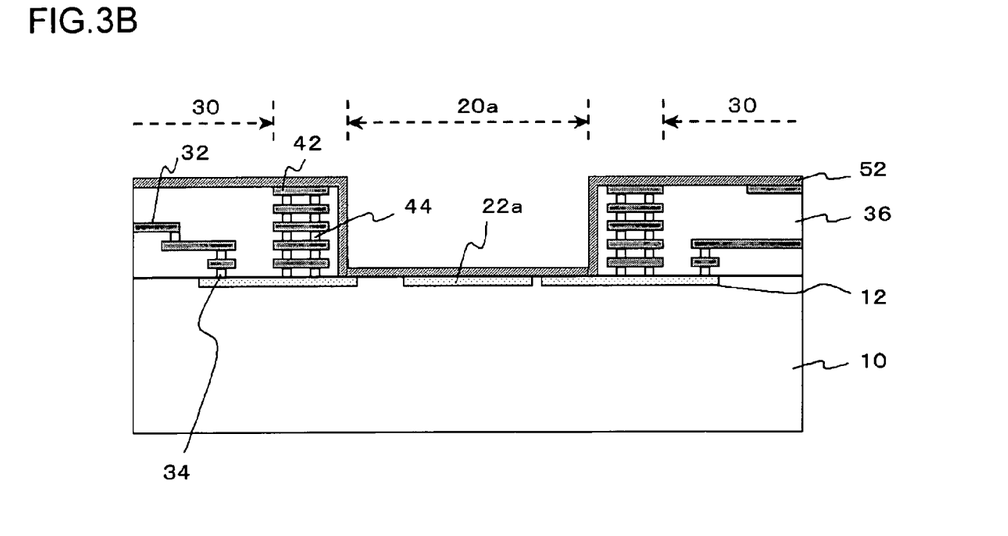
Figure 4A:
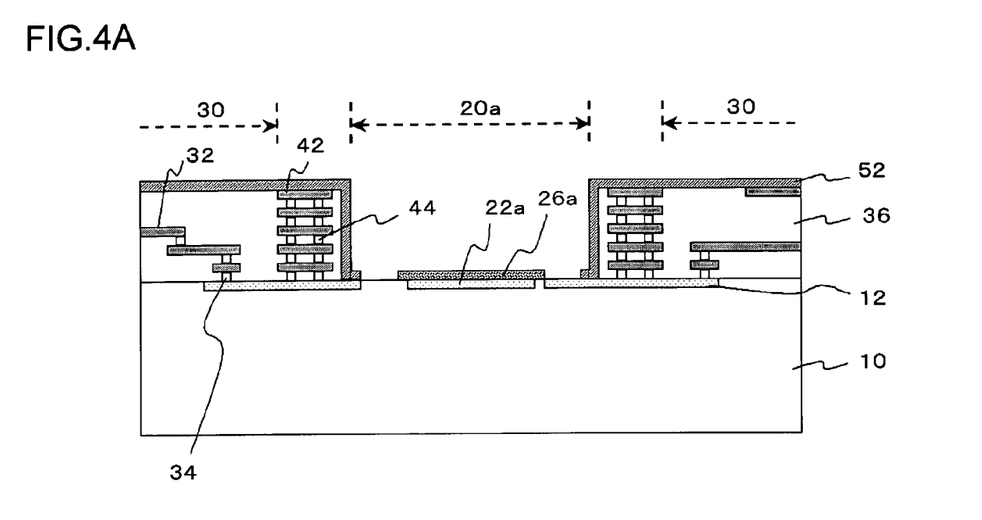
FIGS. 4A and 4B are explanatory views showing an exemplary method for manufacturing the circuit device 1 of FIG. 1.
Figure 4B:
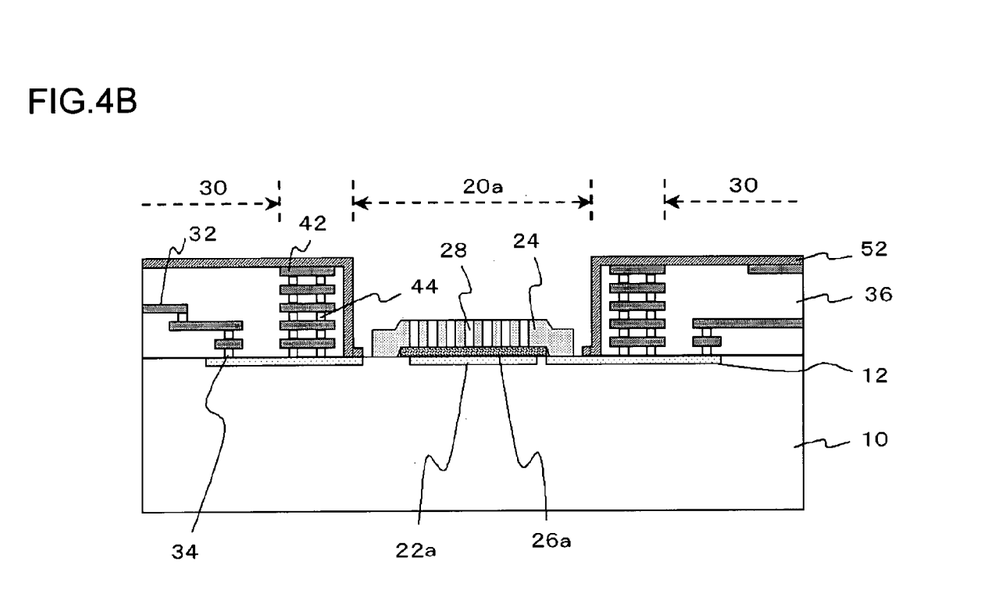
Figure 5A:
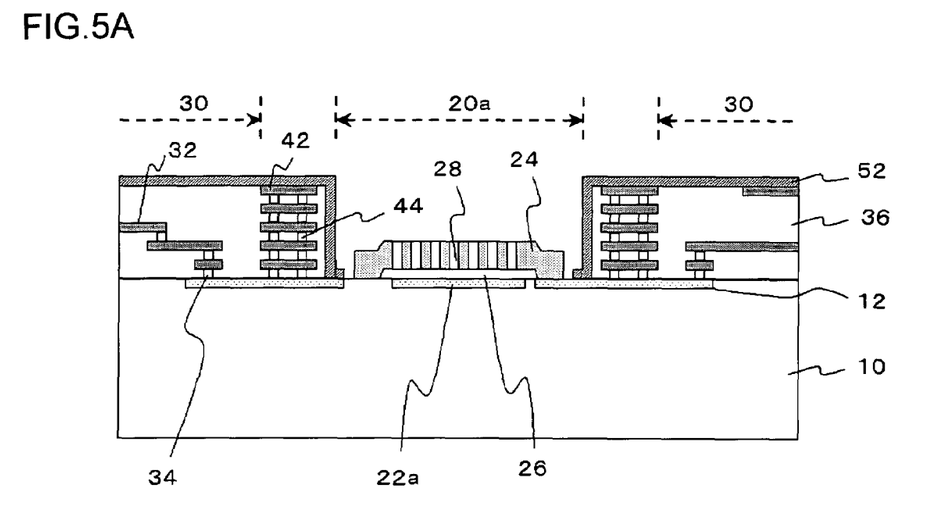
FIGS. 5A and 5B are explanatory views showing an exemplary method for manufacturing the circuit device 1 of FIG. 1.
Figure 5B:
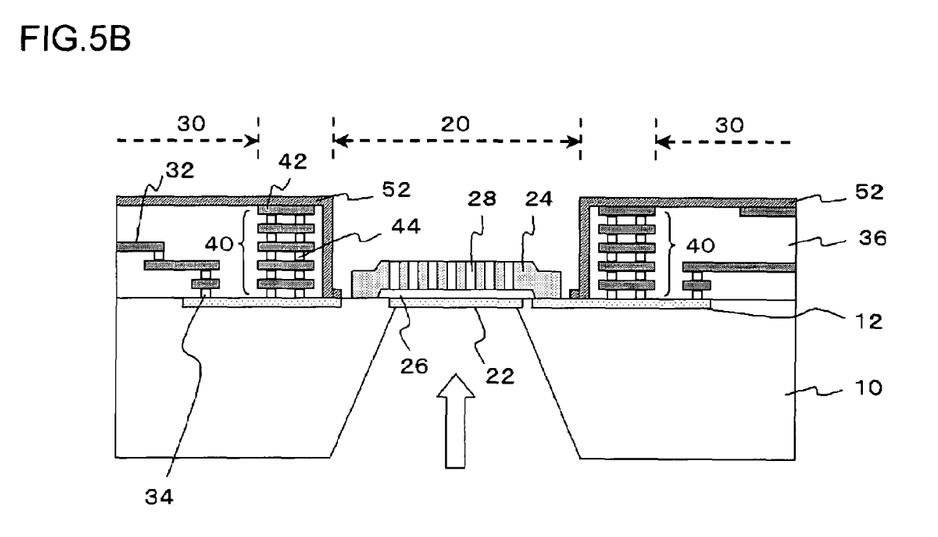

Reference is now made to FIGS. 3 to 5 to describe an exemplary method for manufacturing the circuit device 1 of FIG. 1.

(Step 1) A patterned resist is formed by photolithography on the semiconductor substrate 10 or a silicon substrate, and then boron ions ($B^+$) or the like are implanted by ion implantation.

Here, regions to be implanted with ions include a region 22a where the diaphragm 22 (see FIG. 1) is to be formed, and a region 12a where the conductive layer 12 is to be formed.

These regions 12a and 22a are thus turned to a conductive layer.

For example, conditions for ion implantation are set so that ions reach a depth of 1 μm from the surface of the semiconductor substrate 10.

For boron ions, it is preferable to employ an acceleration energy of about 300 keV.

Ion seeds are not limited to boron but may also be other III-group elements such as Ga or In or alternatively V-group elements such as As or P so long as those elements can make silicon conductive.

Of course, separate control needs to be provided to individual types of ion to optimize their injection energy.

As discussed later in step 14, the ion-doped region 22a will serve as an etching stopper when the diaphragm 22 is formed by etching.

Accordingly, the depth of ion injection is a significantly critical parameter in controlling the sensitivity of the microphone.

[Step 2] Circuit components such as transistors are formed at a region 30a where the circuit area 30 is to be formed.

These circuit components can be formed by the methods which are known to those skilled in the art.

For example, transistors would be formed through the steps well-known to those skilled in the art such as of forming an element isolation region, forming a well, depositing a gate dielectric film, depositing a gate electrode, forming a MOS structure by etching, forming LDDs (Lightly Doped Drain), forming a spacer, and forming sources and drains.

[Step 3] The first layer in the dielectric film 36 is formed.

For example, the layer is 0.8 μm in thickness.

Although the dielectric film is not necessarily formed by a particular method or of a specific seed, a silicon oxide film formed by PE-CVD(plasma enhanced chemical vapor deposition) is preferably employed as the dielectric film.

For example, gases used in the PE-CVD include silane and nitrous monooxide ($SiH_4+N_2O$), silane and oxygen ($SiH_4+O_2$), or TEOS (Tetra-ethoxy-silane) and oxygen ($TEOS+O_2$). For example, deposition is carried out at temperatures of 200 to 500 degrees centigrade.

For a transistor with high shoulders, they may be flattened by CMP or the like after the first inter-layer dielectric film has been formed.

[Step 4] The first layer of the contacts 34 and 44 is formed.

A patterned resist is formed by photolithography on the dielectric film deposited in step 3. Thereafter, via holes are formed by anisotropic etching at the predetermined positions on the dielectric film.

Subsequently, a metal material is buried by CVD or the like in the via holes to thereby serve as the contacts 34 and 44.

[Step 5] A metal film is deposited on the first inter-layer dielectric film and the contacts, and then shaped into a predetermined pattern by photolithography and anisotropic etching.

The first layer of the conductors 32 and 42 is thus formed.

For example, the metal film is about 0.5 μm in thickness.

[Step 6] The second layer of the inter-layer dielectric film is formed (in the same manner as in step 3).

[Step 7] The second layer of the contacts 34 and 44 is formed (in the same manner as in step 4).

[Step 8] The second layer of the conductors 32 and 42 is formed (in the same manner as in step 5).

The steps 6 to 8 are repeated to thereby form the multi-layer conductors. (See FIG. 3A for the steps above.)

[Step 9] The inter-layer dielectric film that has been formed on a region 20a is removed by photolithography and anisotropic etching.

[Step 10] The passivation film 52 is formed on the entire upper surface of the semiconductor substrate 10.

To form an SiN film as the passivation film 52, the PE-CVD can be employed, for example.

For example, gases used here can be silane and ammonia or dichlorosilane and ammonia.

The film is deposited at temperatures, e.g., 300 to 600 degrees centigrade.

It is also acceptable to form a layered structure of SiN film and $SiO_2$ film as the passivation film 52 (FIG. 3B).

The step 9 and step 10 may be followed the other way round.

In this case, although the passivation film 52 is not to be formed on the side face of the dielectric film 36, the sealring 40 can satisfactorily prevent water or moisture from infiltrating from the sensor area 20 into the circuit area 30.

[Step 11] After the passivation film 52 formed on the region 20a is removed by dry etching or the like, a sacrifice layer 26a, e.g., PSG(phosphosilicate glass) film is deposited.

For example, the film is 2 μm in thickness.

The PSG film can be deposited using an additional gas, i.e., $PH_3$ (phosphine) or TMP (trimethylphosphite), under the conditions for depositing the silicon oxide film described in step 3.

The portion where the sacrifice layer 26a is formed will serve as the air gap 26 later (FIG. 4A).

[Step 12] By sputtering or plating, a metal film is deposited so as to cover the entirety of the sacrifice layer 26a.

For example, the metal film is 5 μm in thickness.

Thereafter, openings are formed at the predetermined positions on the metal film by photolithography or etching.

The back plate electrode 24 is thus formed which has the acoustic holes 28 (FIG. 4B).

[Step 13] HF (hydrogen fluoride) or the like is allowed into the sacrifice layer 26a through the acoustic holes 28 of the back plate electrode 24, thereby removing the sacrifice layer 26a by etching.

The air gap 26 is formed in this manner (FIG. 5A).

[Step 14] Finally, an etching mask with the region 20a opened is formed on the reverse surface of the semiconductor substrate 10 for isotropic etching using an alkali etchant such as KOH or TMAH.

In this case, the region 12a into which ions have been injected in step 1 serves as an etching stopper, allowing the diaphragm 22 to be formed.

Through the steps in the forgoing, the circuit device 1 is obtained (FIG. 5B).

To use Cu conductors as the conductors 32 and 42, the so-called dual damascene process can be employed.

Reference is now made to this process in relation to only the steps different from those in the aforementioned fabrication method (i.e., to steps 5 through 8).

In the aforementioned step 5, the second inter-layer dielectric film layer is formed on the first contact layer.

The first conductor groove is also formed in the second inter-layer dielectric film layer by photolithography and anisotropic etching.

Additionally, copper is deposited in the conductor groove by plating or CVD, thereby allowing the copper to be buried in the conductor groove.

Thereafter, the copper on the other portion than in the conductor groove is removed by CMP to form the first damascene conductor.

In the step 6, the third inter-layer dielectric film layer is formed (in the same manner as in step 3).

In the step 7, the second contact hole is formed.

At this stage, no metal material is buried in the second contact hole.

In the step 8, the second conductor groove is formed in the third inter-layer dielectric film layer by photolithography and anisotropic etching, and then copper is buried in the second contact hole and the second conductor groove.

The second contact and the second damascene conductor are thus simultaneously formed.

Second Embodiment

Figure 6:
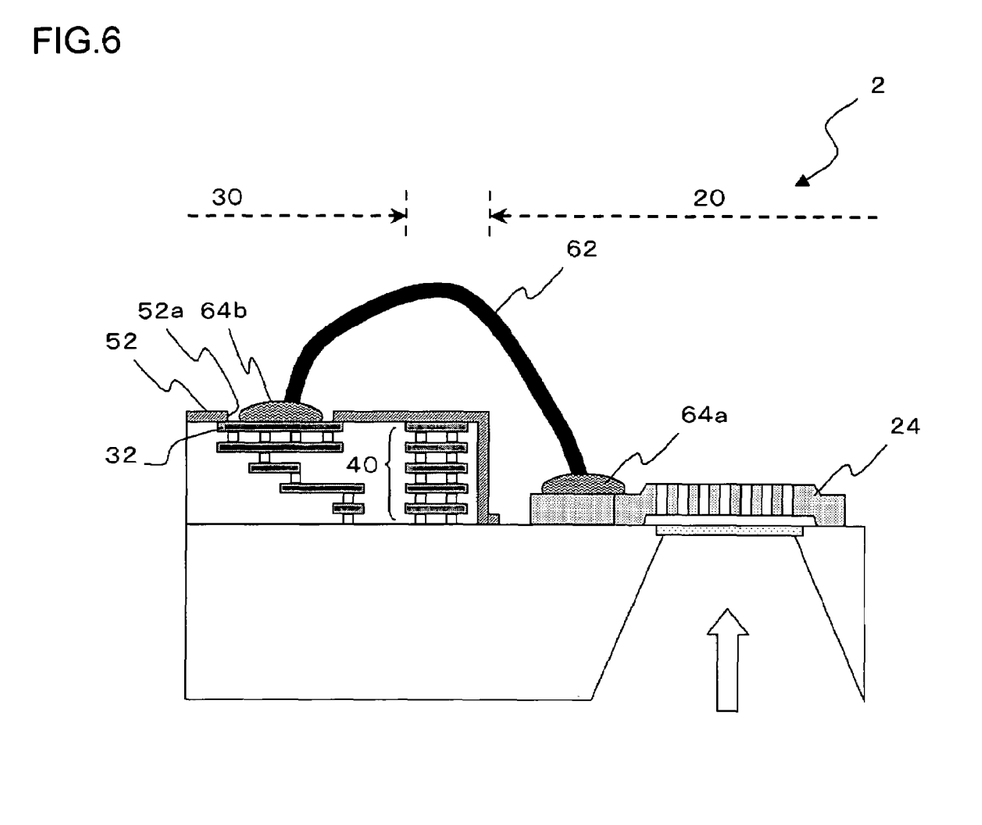
FIG. 6 is a cross-sectional view showing a circuit device according to a second embodiment of the present invention.

FIG. 6 is a cross-sectional view showing a circuit device according to a second embodiment of the present invention.

Figure 7:
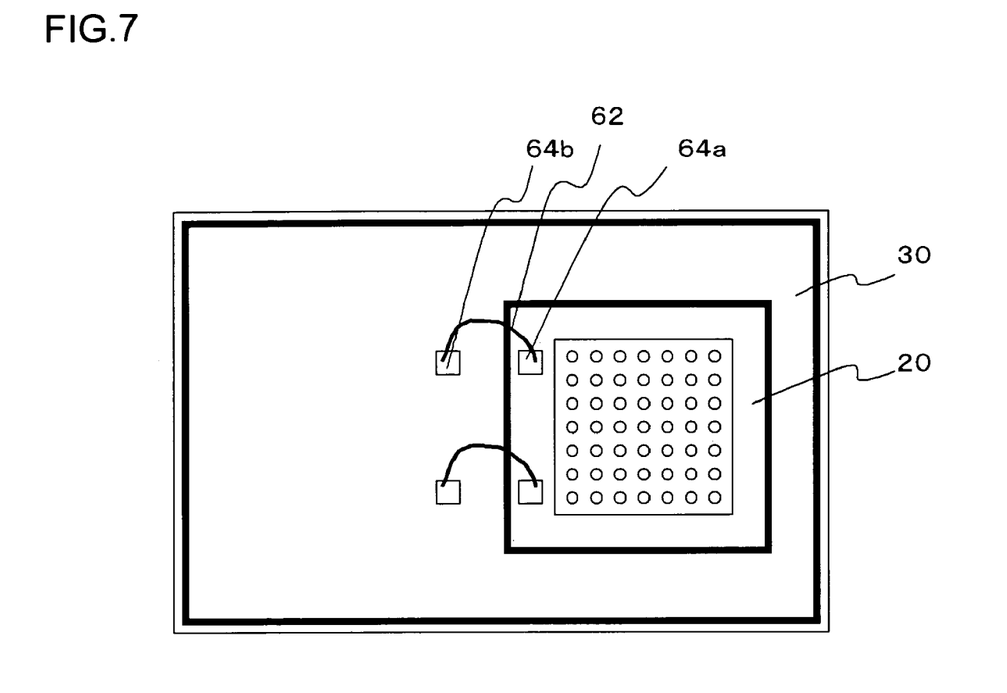
FIG. 7 is a plan view showing the circuit device according to the second embodiment of the present invention.

FIG. 7 is a plan view showing the circuit device according to the second embodiment of the present invention.

Like the circuit device 1 of FIG. 1, the circuit device 2 includes the sensor area 20, the circuit area 30, and the sealring 40 disposed therebetween.

The circuit device 2 also includes a bonding wire 62 for electrically connecting between the sensor area 20 and the circuit area 30.

More specifically, one end of the bonding wire 62 is connected to a bonding pad 64a formed on par of the back plate electrode 24 of the sensor area 20, while the other end is connected to a bonding pad 64b formed on the uppermost layer of the conductors 32 of the circuit area 30.

Here, to form the bonding pad 64b, the passivation film 52 covering the circuit area 30 is partially removed to provide an opening 52a.

In this embodiment, since the bonding wire 62 provides electrical connection between the sensor area 20 and the circuit area 30, no conductive layer 12 (see FIG. 1) is formed on the semiconductor substrate 10.

The circuit device 2 is also provided with the sealring 40, thereby preventing water or moisture from infiltrating from the sensor area 20 into the circuit area 30.

The circuit device 2 is thus realized which can be manufactured at reduced costs and which is highly reliable.

Furthermore, the circuit device 2 includes the bonding wire 62 for electrically connecting between the sensor area 20 and the circuit area 30.

Thus, this simple arrangement allows for communicating electric signals between the sensor area 20 and the circuit area 30.

This arrangement provides reduced resistance when compared to communications of electric signals via the conductive layer 12 of FIG. 1, thereby making it possible to communicate signals at higher speeds between the sensor area 20 and the circuit area 30.

Third Embodiment

Figure 8:
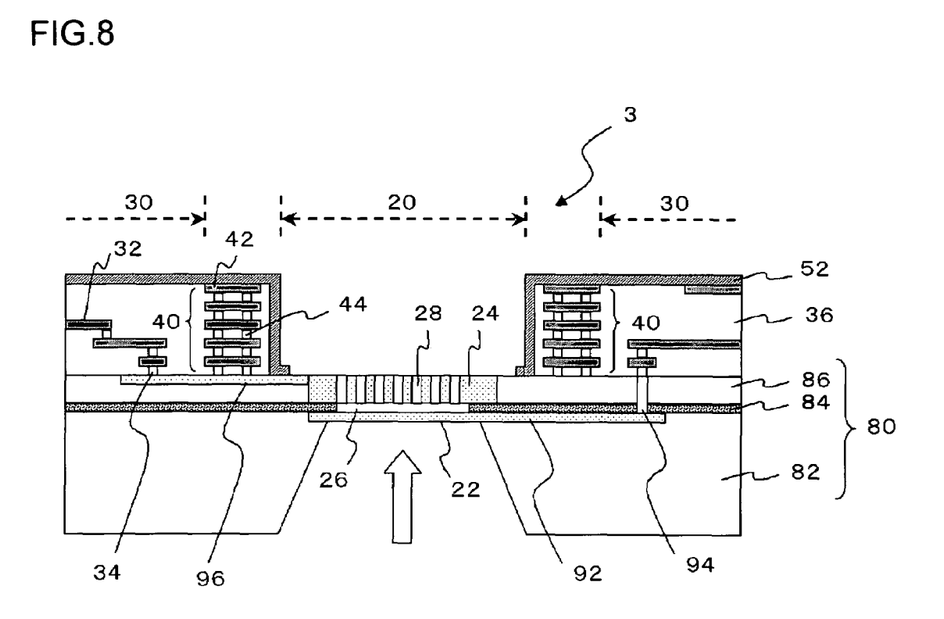
FIG. 8 is a cross-sectional view showing a circuit device according to a third embodiment of the present invention.

FIG. 8 is a cross-sectional view showing a circuit device according to a third embodiment of the present invention.

Like the circuit device 1 of FIG. 1, the circuit device 3 includes the sensor area 20, the circuit area 30, and the sealring 40 disposed therebetween.

In the circuit device 3, a semiconductor substrate 80 is an SOI substrate including a buried oxide film 84 and a silicon film 86 which are stacked in layers in that order on a silicon substrate 82.

Here, the diaphragm 22 of the sensor area 20 is formed on the bottom surface of the buried oxide film 84 in the silicon substrate 82.

The back plate electrode 24 is buried in the silicon film 86.

Between the diaphragm 22 and the back plate electrode 24 is the air gap 26 that is formed by removing the buried oxide film 84.

The diaphragm 22 is electrically connected to the lowermost layer of the contacts 34 in the circuit area 30 via conductive layers 92 and 94.

The conductive layer 92 extends to the surface of the silicon substrate 82.

One end of the conductive layer 92 is in contact with the diaphragm while the other end reaches below the circuit area 30.

The conductive layer 94 penetrates the buried oxide film 84 and the silicon film 86, with one end in contact with the conductive layer 92 and the other end in contact with the contact 34.

On the other hand, the back plate electrode 24 is electrically connected to the contact 34 via a conductive layer 96 that extends on the surface of the silicon film 86.

The circuit device 3 is also provided with the sealring 40, thereby preventing water or moisture from infiltrating from the sensor area 20 into the circuit area 30.

The circuit device 3 is thus realized which can be manufactured at reduced costs and which is highly reliable.

Furthermore, an SOI substrate is employed as the semiconductor substrate 80. Thus, unlike the fabrication steps for the circuit device 1, the circuit device 3 requires no step of forming the sacrifice layer 26a.

Accordingly, the fabrication steps of the circuit device 3 can be simplified.

Figure 9A:
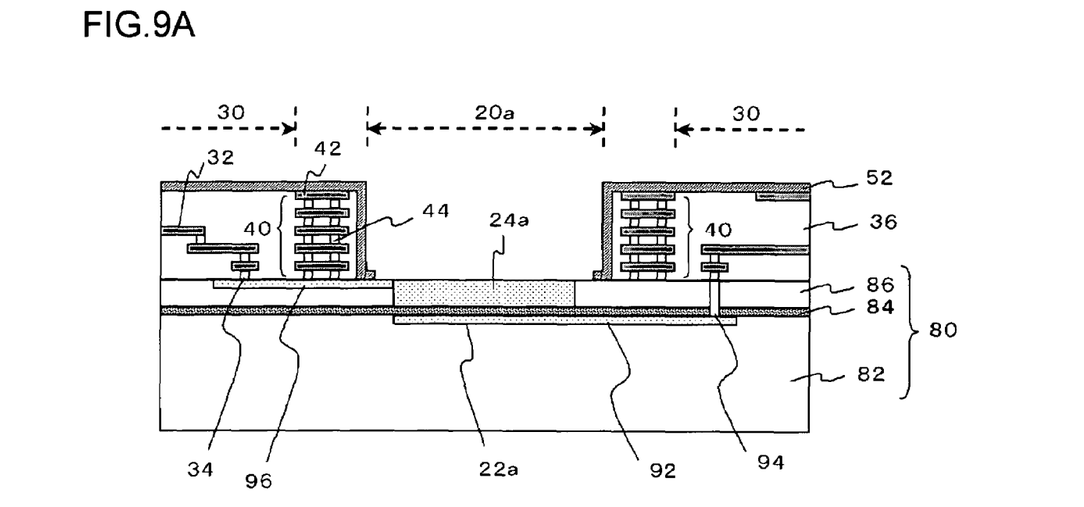
FIGS. 9A and 9B are explanatory views showing an exemplary method for manufacturing the circuit device 3 of FIG. 8.
Figure 9B:
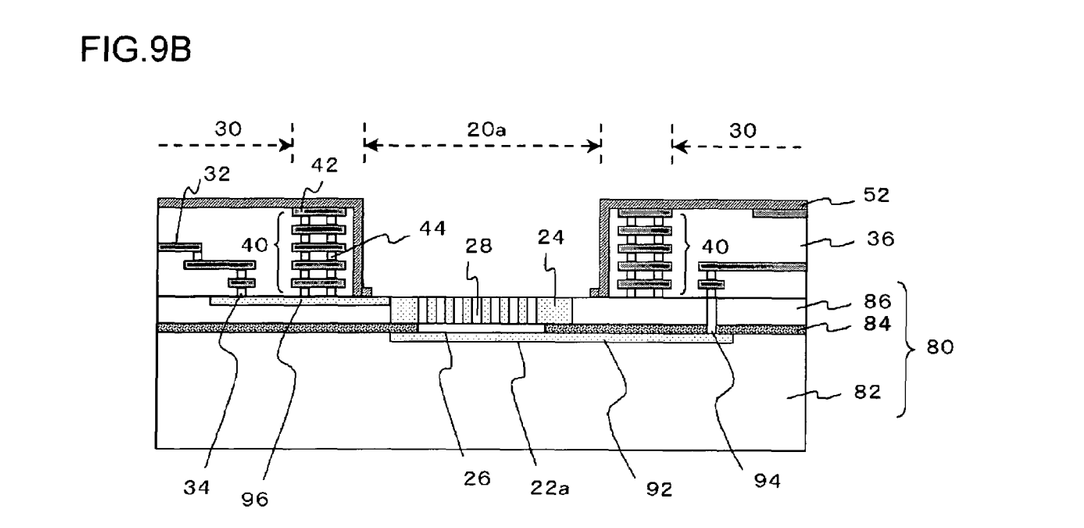
Figure 10:
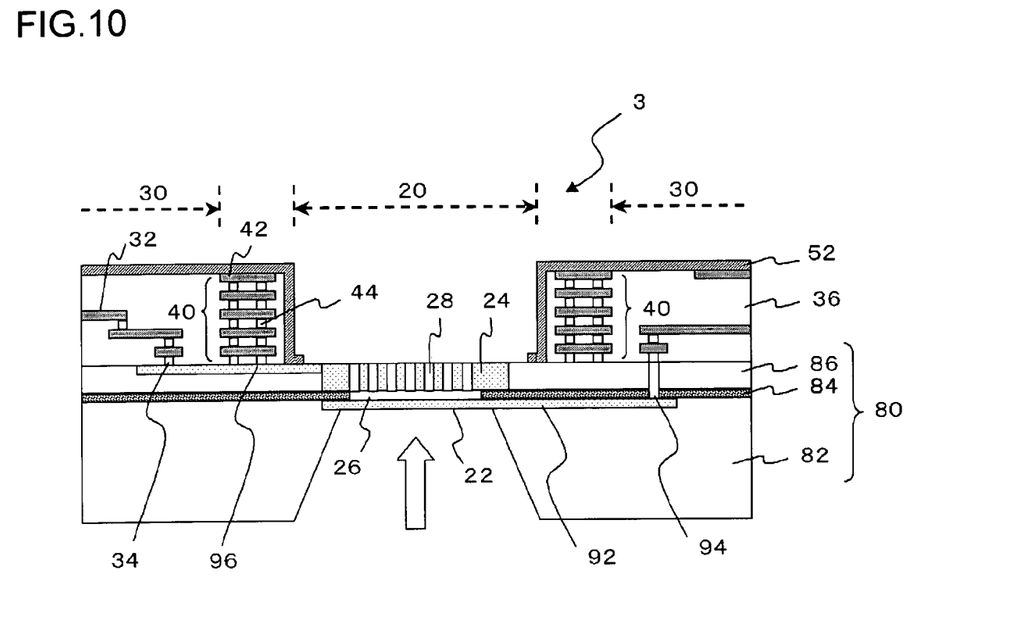
FIG. 10 is an explanatory view showing an exemplary method for manufacturing the circuit device 3 of FIG. 8.

Reference is now made to FIGS. 9 and 10 to described an exemplary method for fabricating the circuit device 3 of FIG. 8.

Unless otherwise specified, the fabrication steps of the circuit device 3 are the same as those for the circuit device 1 of FIG. 1.

First prepared is the semiconductor substrate 80 on which the aforementioned conductive layers 92, 94, and 96 are formed.

At this time, conductive layers are also formed on the region 22a where the diaphragm 22 is to be formed and on a region 24a where the back plate electrode 24 is to be formed.

The circuit area 30 and the sealring 40 are also formed on the semiconductor substrate 80 in the same manner as for the circuit device 1 of FIG. 1.

Additionally, after the inter-layer dielectric film in the region 20a where the sensor area 20 is to be formed has been removed, the passivation film 52 is formed on the entire upper surface of the semiconductor substrate 80.

Thereafter, the passivation film 52 formed on the region 20a is removed (FIG. 9A).

Then, the predetermined region of the conductive layer formed in the region 24a is etched to thereby form the back plate electrode 24 having the acoustic holes 28.

The buried oxide film 84 between the region 22a and the back plate electrode 24 is removed by HF processing to thereby form the air gap 26 (FIG. 9B).

Finally, the reverse side of the semiconductor substrate 80 is etched to form the diaphragm 22.

Through the steps in the forgoing, the circuit device 3 is obtained (FIG. 10).

Fourth Embodiment

Figure 11:
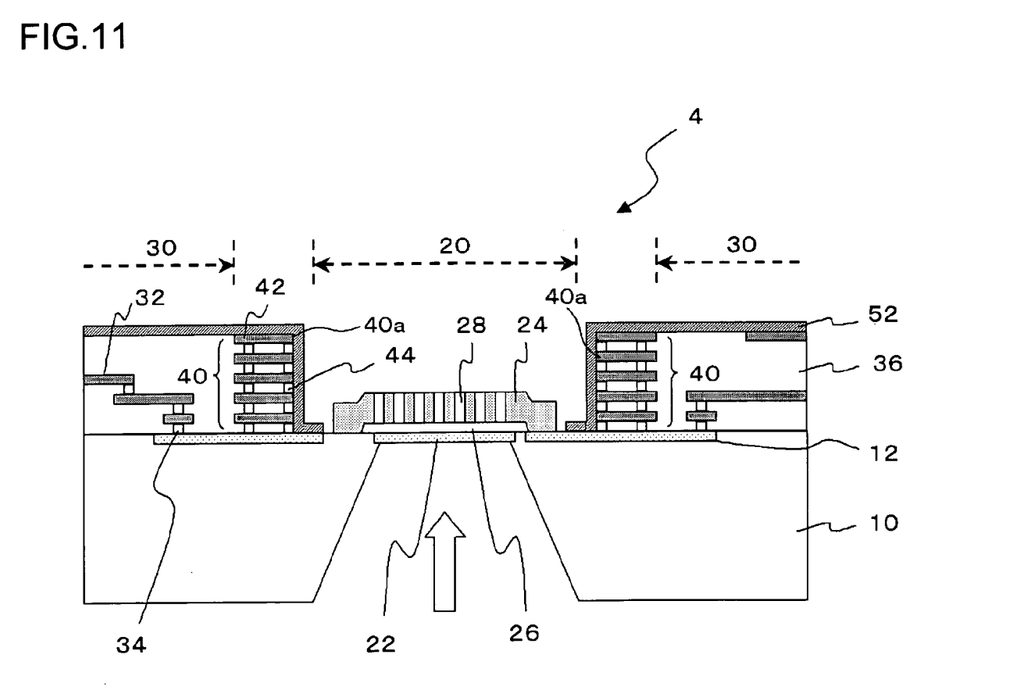
FIG. 11 is a cross-sectional view showing a circuit device according to a fourth embodiment of the present invention.

FIG. 11 is a cross-sectional view showing a circuit device according to a fourth embodiment of the present invention.

Like the circuit device 1 of FIG. 1, the circuit device 4 includes the sensor area 20, the circuit area 30, and the sealring 40 disposed therebetween.

In the circuit device 4, the sealring 40 has a substantially flat surface opposed to the sensor area 20.

More specifically, the end face of the conductors 42 opposed to the sensor area 20 is flush with the end face of the contacts 44 opposed to the sensor area 20.

Additionally, the dielectric film 36 is not provided beyond a side face 40a of the sealring 40 toward the sensor area 20, with the side face 40a covered directly with the passivation film 52.

The circuit device 4 is also provided with the sealring 40, thereby preventing water or moisture from infiltrating from the sensor area 20 into the circuit area 30.

The circuit device 4 is thus realized which can be manufactured at reduced costs and which is highly reliable.

Furthermore, the side face 40a of the sealring 40 is flat.

To this end, in manufacturing the circuit device 4, the sealring 40 serves as an etching stopper in the step of removing the inter-layer dielectric film of the sensor area 20 by etching, thereby flattening the exposed surface (i.e., the side face 40a) after having been etched.

This arrangement provides an improved coverage effect to the passivation film 52.

It is thus possible to improve the repeatability of the process and obtain a highly reliable circuit device 4 as well.

The circuit device according to the present invention is not limited to the aforementioned embodiments but may also be modified in a variety of ways.

For example, the sensor is not limited to a microphone but may also be other sensors such as odor sensors.

Figure 12:
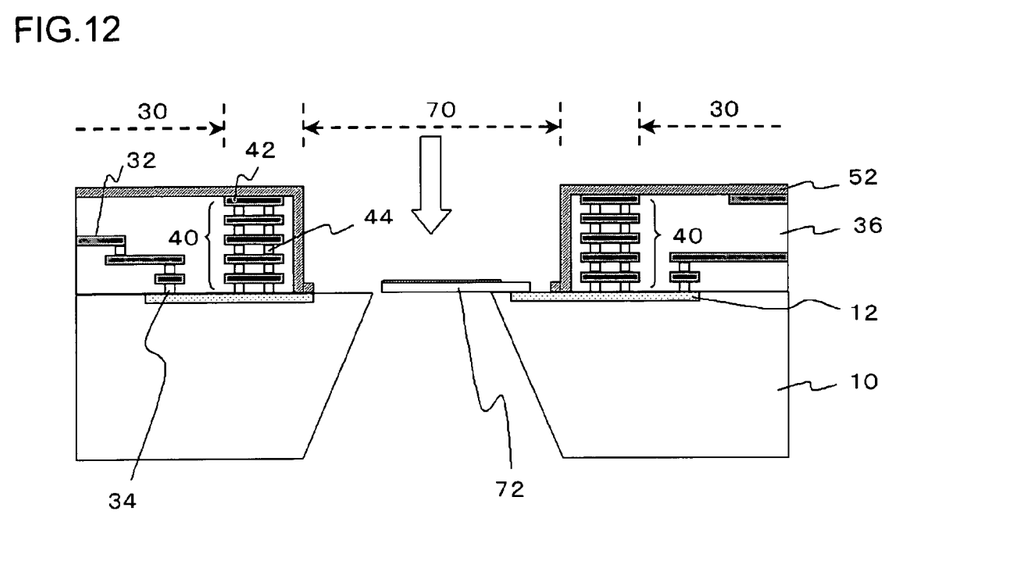
FIG. 12 is a cross-sectional view showing an exemplary configuration of a circuit device with an odor sensor.

FIG. 12 is a cross-sectional view showing an exemplary configuration of a circuit device with an odor sensor.

Figure 13:
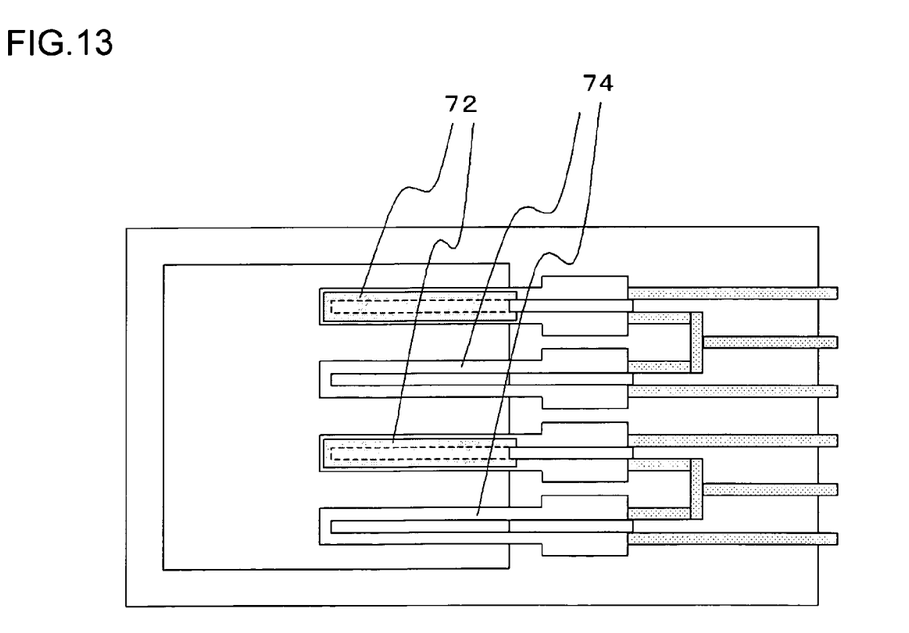
FIG. 13 is a plan view showing a sensor area 70 in the circuit device of FIG. 12.

FIG. 13 is a plan view showing a sensor area 70 in this circuit device.

The sensor area 70 includes a measurement cantilevers 72 coated with an organic polymer and a reference cantilevers 74 coated with no organic polymer, the cantilevers 72 and 74 being alternately arranged.

The cantilevers are formed of polysilicon serving as a piezo element.

The reference cantilever 74 is intended to compensate for variations in temperature and pressure.

There are provided a plurality of pairs of the measurement cantilever 72 and the reference cantilever 74, each pair being formed of mutually different types of polymer.

In this example, as shown in FIG. 13, the measurement cantilever 72 and the reference cantilever 74 are incorporated into a Wheatstone bridge circuit but may also be implemented in other types of circuits.

In the sensor area 70 configured as described above, exposure of the measurement cantilever 72 to an odor (as indicated by the arrow in FIG. 12) would cause the odor producing substance and the polymer on the measurement cantilever 72 to react with each other, resulting in the polymer film being expanded or contracted.

This is followed by deflection in a cantilever.

Then, the circuit area 30 processes an electric signal from the cantilever, thereby determining the odor.

The number of pairs of the measurement cantilever 72 and the reference cantilever 74 can be increased to thereby determine a larger number of types of odor.

On the other hand, the aforementioned embodiments employ the sealring as an example of the moisture resistant member. However, the moisture resistant member is not necessarily limited to an annular one.

Figure 14A:
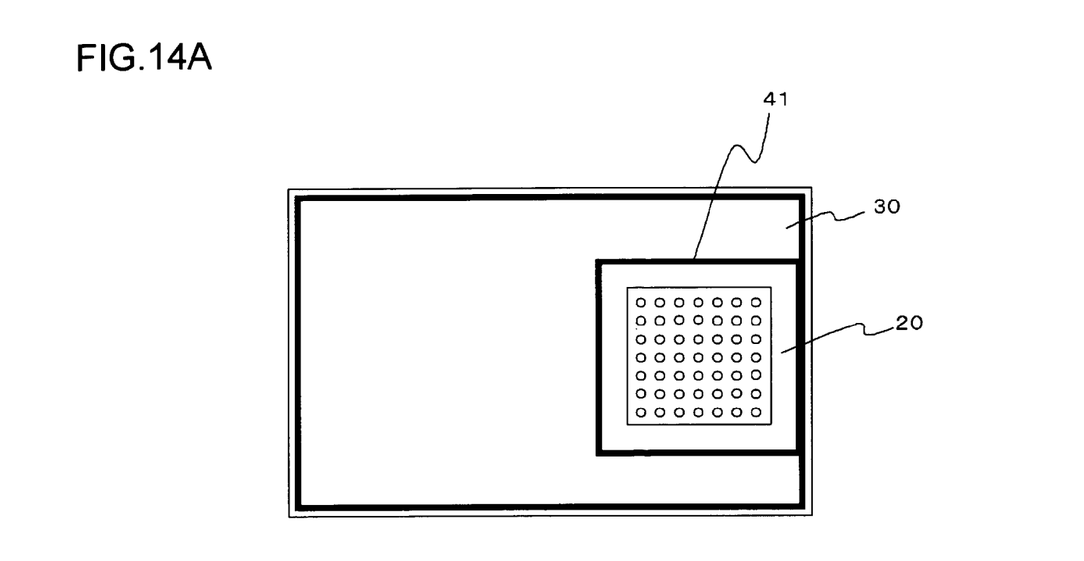
FIGS. 14A and 14B are explanatory views showing a modified example of a circuit device according to an embodiment.
Figure 14B:
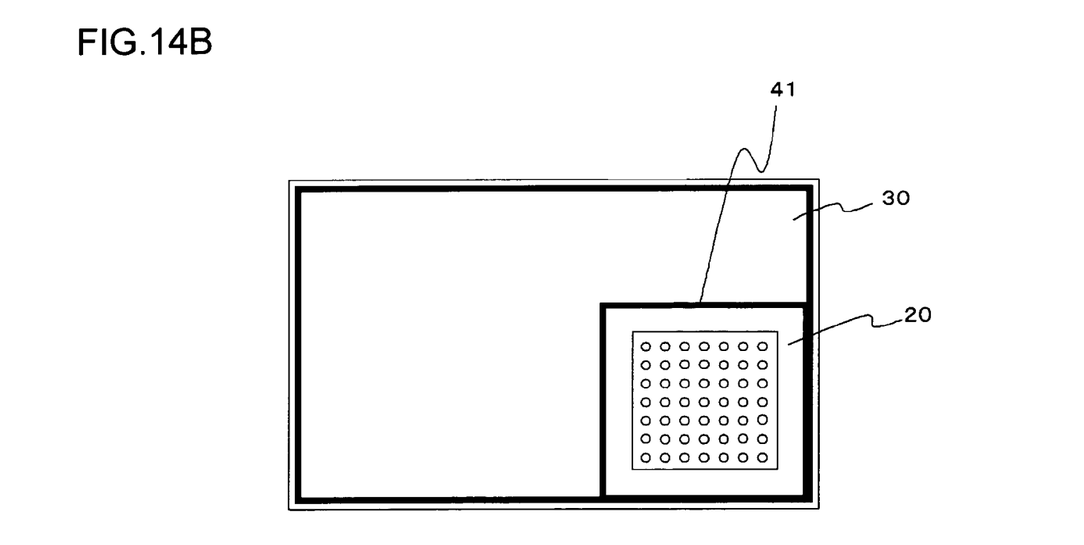

For example, as shown in FIGS. 14A and 14B, a moisture resistant member 41 may be partially provided around the sensor area 20.

In FIG. 14A, only three of the four sides around the sensor area 20 are adjacent to the circuit area 30.

Accordingly, the moisture resistant member 41 is also formed only on the aforementioned three sides around the sensor area 20 which are adjacent to the circuit area 30.

In FIG. 14B, only two sides around the sensor area 20 are adjacent to the circuit area 30, with the moisture resistant member 41 formed only on the two sides.

In FIGS. 14A and 14, the moisture resistant member 41 is continuously formed to define the sensor area 20 and the circuit area 30.

For example, like the sealring 40, the moisture resistant member 41 is configured such that the conductors 42 and the contacts 44 are stacked alternately in layers.

What is claimed is:

1. A circuit device comprising:
a sensor area formed on part of a substrate;
a circuit area formed around the sensor area on the substrate to process a signal produced at the sensor area; and
a moisture resistant member disposed between the sensor area and the circuit area
wherein: the moisture resistant member is formed of conductors and contacts stacked alternately in layers; and the conductors and contacts are formed of the same materials as used for conductors and contacts of the circuit area, respectively.

2. The circuit device according to claim 1, wherein the substrate has a conductive layer for electrically connecting between the sensor area and the circuit area.

3. The circuit device according to claim 1, comprising a second moisture resistant member disposed to surround the circuit area.

4. The circuit device according to claim 1, wherein an upper surface of the circuit area is coated with a passivation film.

5. The circuit device according to claim 1, wherein the moisture resistant member is formed continuously to define the sensor area and the circuit area.

6. The circuit device according to claim 1, wherein the moisture resistant member has a substantially flat side face opposed to the sensor area.

7. The circuit device according to claim 6, wherein the substrate has a conductive layer for electrically connecting between the sensor area and the circuit area.

8. The circuit device according to claim 3, comprising a second moisture resistant member disposed to surround the circuit area.

9. The circuit device according to claim 8, wherein an upper surface of the circuit area is coated with a passivation film.

10. The circuit device according to claim 6, wherein the moisture resistant member is formed continuously to define the sensor area and the circuit area.

* * * * *